US008116074B2

(12) United States Patent
Tsai et al.

(10) Patent No.: US 8,116,074 B2
(45) Date of Patent: Feb. 14, 2012

(54) REMOVABLE MECHANISM FOR DRAWING AN OBJECT AND REMOVABLE DEVICE THEREOF

(75) Inventors: Yu-Han Tsai, Taipei Hsien (TW); Chun-Wang Lin, Taipei Hsien (TW); Feng-Hsiung Wu, Taipei Hsien (TW); Chi-Jen Lo, Taipei Hsien (TW)

(73) Assignee: Wistron Corporation, Xizhi Dist., New Taipei (TW)

(*) Notice: Subject to any disclaimer, the term of this patent is extended or adjusted under 35 U.S.C. 154(b) by 180 days.

(21) Appl. No.: 12/725,472

(22) Filed: Mar. 17, 2010

(65) Prior Publication Data

US 2011/0032670 A1 Feb. 10, 2011

(30) Foreign Application Priority Data

Aug. 5, 2009 (TW) ................................ 98126370 A

(51) Int. Cl.
*G06F 1/16* (2006.01)

(52) U.S. Cl. ..................... 361/679.31; 312/408; 347/19; 369/77.1

(58) Field of Classification Search .................... 347/16, 347/19, 8; 361/679.01, 679.02, 679.21, 679.22, 361/679.23, 679.27, 679.31, 679.32, 679.33; 312/221, 110, 408, 334.8; 248/416, 58, 430, 248/429, 541; 160/340, 168.1 R; 369/75.1, 369/75.2, 77.1

See application file for complete search history.

(56) References Cited

U.S. PATENT DOCUMENTS 6,693,868 B2 * 2/2004 Saito ............................ 720/622
6,980,434 B2 * 12/2005 Ou Yang et al. .............. 361/695
7,481,704 B2 * 1/2009 Kao et al. ...................... 454/184

FOREIGN PATENT DOCUMENTS

CN 201340581 Y 11/2009

* cited by examiner

*Primary Examiner* — Hung Duong
(74) *Attorney, Agent, or Firm* — Winston Hsu; Scott Margo

(57) ABSTRACT

A removable mechanism for drawing an object from a housing is disclosed. The removable mechanism includes a first rail disposed inside the housing and on a side of the object for guiding the object to move inside the housing. The removable mechanism further includes a driving rod installed on the first rail in a movable manner for driving the object to move in a first direction, and a pull rod pivoted to the driving rod for pulling the driving rod to drive the object to move in the first direction so as to eject from the housing when being rotated out of the housing and being pulled.

17 Claims, 5 Drawing Sheets

50
52
54
X
521
64
62
56
58
60

REMOVABLE MECHANISM FOR DRAWING AN OBJECT AND REMOVABLE DEVICE THEREOF

BACKGROUND OF THE INVENTION

1. Field of the Invention

The present invention relates to a removable mechanism for drawing an object and a removable device thereof, and more particularly, to a removable mechanism utilizing a rotary pulling rod to draw an object and a removable device thereof.

2. Description of the Prior Art

A computer capable of being disassembled easily preferably corresponds to a user's demand in order to disassemble broken components from a computer for detecting and fixing or to disassemble old-type components for updating. A storage device, such a hard disk, is a necessary apparatus of the computer. Therefore, design of assembling and disassembling the storage device conveniently is an important issue. Because a conventional portable electronic device, such as a notebook computer, an ultra mobile PC, and so on, trends toward a small size, a small size solid state drive (SSD) is utilized to replace the general hard disk in the storage device. In order to assembly and disassembly the SSD easily, an opening is formed on a lateral side of a host for moving in/out the SSD. In addition, the SSD is disposed on a position away from the opening so as to achieve waterproof and dustproof functions. Due to a distance between the SSD and the opening and a thickness of the small size host, dimensions of the opening is small so that the user can not take the SSD away via the opening conveniently and easily. A conventional method for drawing out the SDD is that installing a pulling belt made of mylar material on a pulling end of the hard disk, however, the pulling belt can not be reused on the other hard disk after exchanging the original hard disk. Thus, a removable mechanism capable of reusing and operating easily is an important issue in the mechanical design of the computer industry.

SUMMARY OF THE INVENTION

The present invention provides a removable mechanism utilizing a rotary pulling rod to draw an object and a removable device thereof for solving above drawbacks.

According to the claimed invention, a removable mechanism includes a first rail disposed inside a housing and on a side of an object for guiding the object to move inside the housing, a driving rod installed on the first rail in a movable manner for driving the object to move in a first direction, and a pulling rod pivoted to the driving rod for pulling the driving rod to drive the object to move in the first direction so as to eject from the housing when being rotated out of the housing and being pulled.

According to the claimed invention, a removable device includes a housing whereon an opening is formed, an object disposed inside the housing in a removable manner, and a removable mechanism for ejecting the object from the opening on the housing in a first direction. The removable mechanism includes a first rail disposed inside the housing and on a side of the object for guiding the object to move inside the housing, a driving rod disposed inside the housing and installed on the first rail in a movable manner for driving the object to move in the first direction, and a pulling rod pivoted to the driving rod for pulling the driving rod to drive the object to move in the first direction so as to eject from the opening on the housing when being rotated out of the housing and being pulled.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
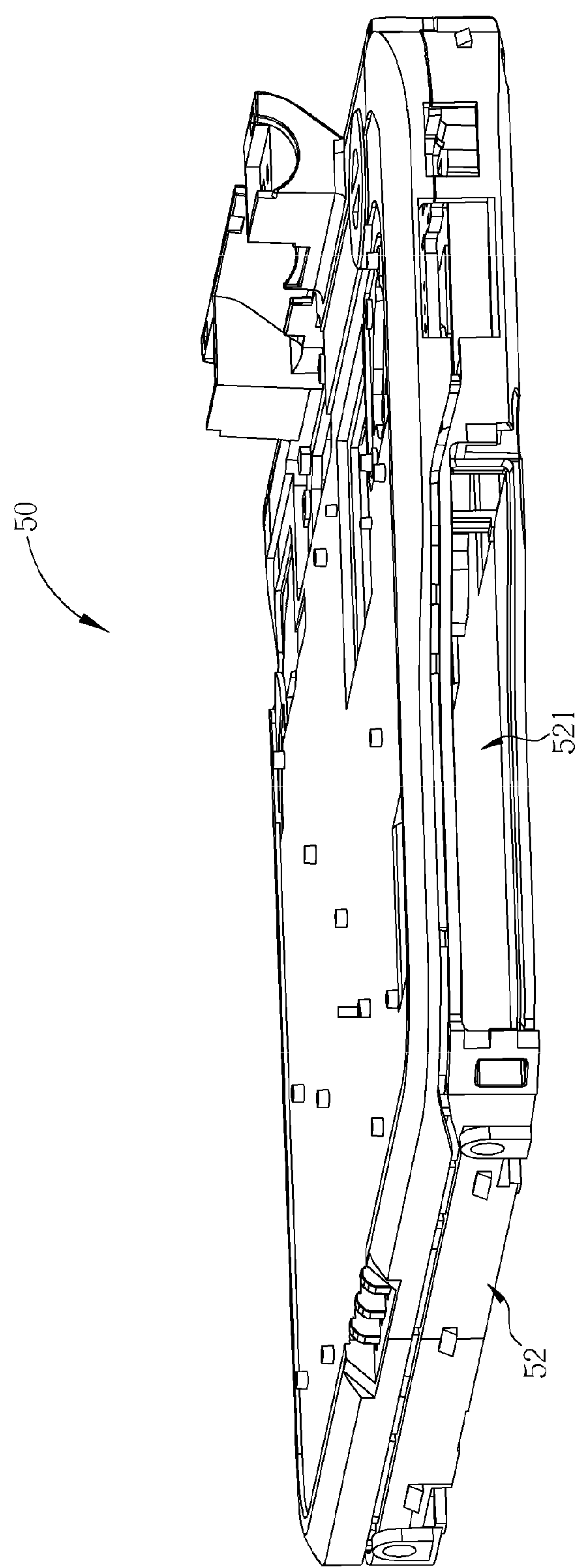
FIG. 1 is a schematic diagram of a removable device according to a preferred embodiment of the present invention.

Please refer to FIG. 1. FIG. 1 is a schematic diagram of a removable device 50 according to a preferred embodiment of the present invention. The removable device 50 can be a portable electronic device, such as a notebook computer, an ultra mobile PC (UMPC), and so on. The removable device 50 includes a housing 52 for covering internal components. An opening 521 is formed on the housing 52. A waterproof covering (not shown in figure) can be disposed on an external side of the opening 521 selectively so as to achieve waterproof and dustproof functions.

Figure 2:
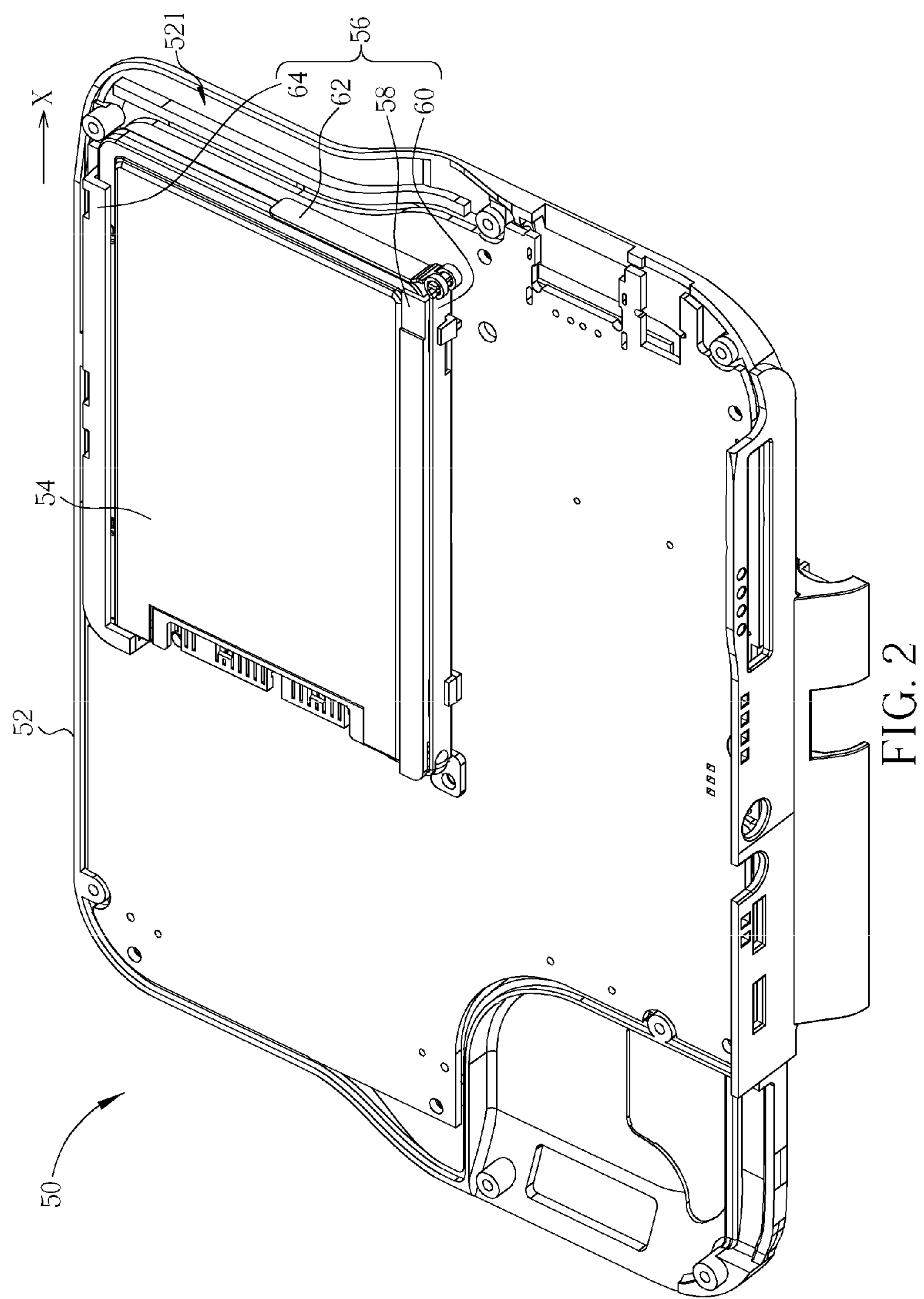
FIG. 2 is a diagram of an internal structure of the removable device according to the preferred embodiment of the present invention.

Please refer to FIG. 2. FIG. 2 is a diagram of an internal structure of the removable device 50 according to the preferred embodiment of the present invention. The removable device 50 further includes an object 54 disposed inside the housing 52 in a removable manner. The object 54 can be a storage module, such as a hard disk, an optical disk drive, and so on. The object 54 can be a solid state drive (SSD) so as to be a storage module of the UMPC. The removable device 50 further includes a removable mechanism 56 for ejecting the object 54 from the opening 521 on the housing 52 in a first direction (X direction). The removable mechanism 56 includes a first rail 58 disposed inside the housing 52 and on a side of the object 54 for guiding the object 54 to move inside the housing 52. The first rail 58 can be locked inside the housing 52. If the object 54 is the SSD with an iron casing, in order to remove the SSD smoothly, the first rail 58 can be made of plastic material so as to decrease friction generated between the metal components sliding relative to each other. The removable mechanism 56 further includes a driving rod 60 disposed inside the housing 52 and installed on the first rail 58 in a movable manner for driving the object 54 to move in the first direction (X direction). The driving rod 60 can be made of metal material.

Figure 3:
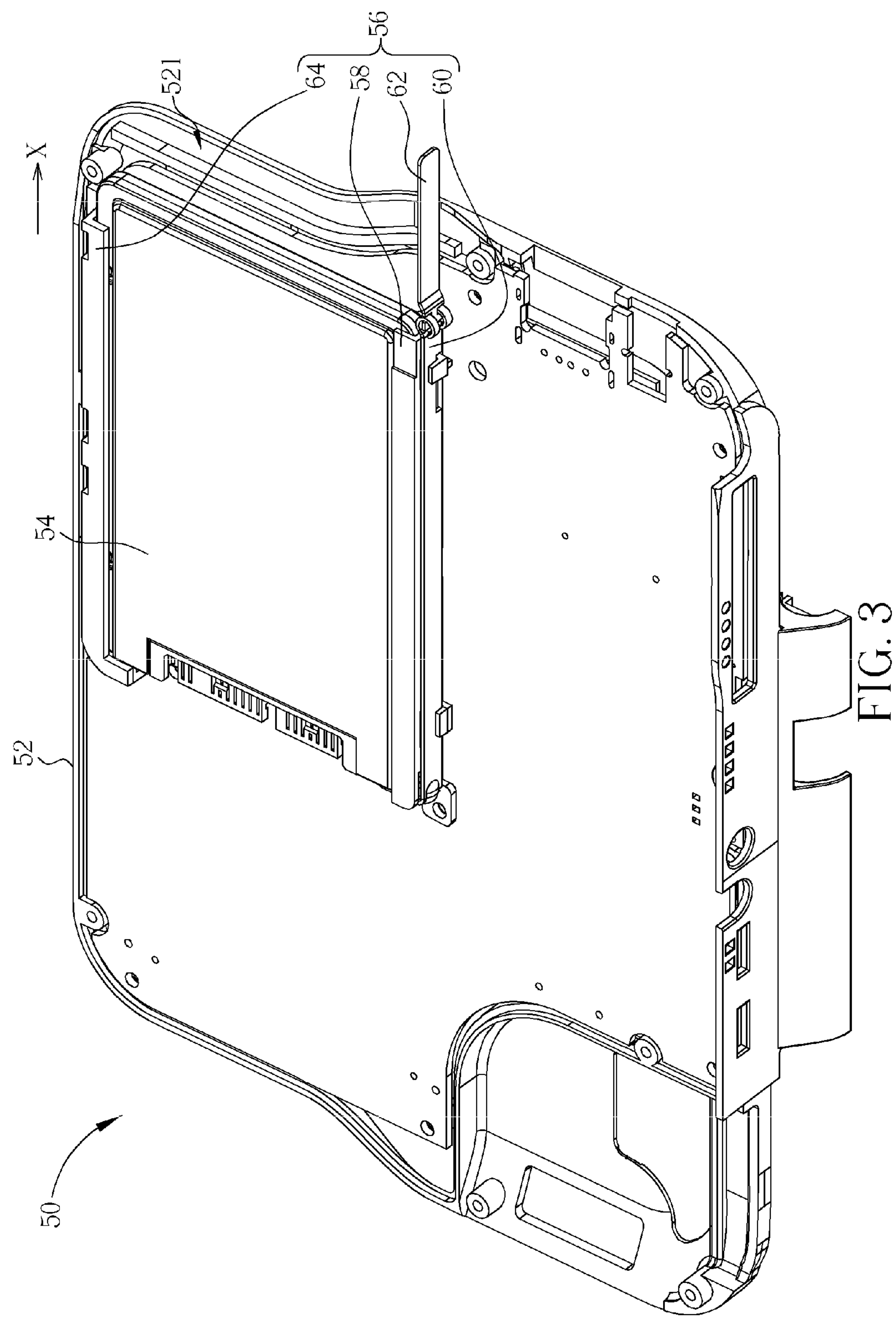
FIG. 3 is a diagram of a pulling rod being rotated out of a housing according to the preferred embodiment of the present invention.

The removable mechanism 56 further includes a pulling rod 62 pivoted to the driving rod 60. Please refer to FIG. 3. FIG. 3 is a diagram of the pulling rod 62 being rotated out of the housing 52 according to the preferred embodiment of the present invention. The pulling rod 62 can be rotated out of the housing 52. The removable device 50 can be overturned at a specific angle so that an end of the pulling rod 62 is rotated out of the opening 521 on the housing 52 automatically by gravity. Or a user can pull the pulling rod 62 out of the opening 521 on the housing 52 by a finger or a stick. When the pulling rod 62 is rotated out of the housing 52, the user can draw the pulling rod 62 for pulling the driving rod 60 to drive the object 54 to move in the first direction (X direction) so as to eject the object 54 from the opening 521 on the housing 52. The pulling rod 62 can be made of metal material. The removable mechanism 56 further includes a second rail 64 disposed inside the housing 52 and on the other side of the object 54 for guiding the object 54 to move inside the housing 52 with the first rail 58. The second rail 64 can be locked inside the housing 52. If the object 54 is the SSD with the iron casing, in order to remove the SSD smoothly, the second rail 64 can be made of plastic material so as to decrease the friction generated between the metal components sliding relative to each other.

Figure 4:
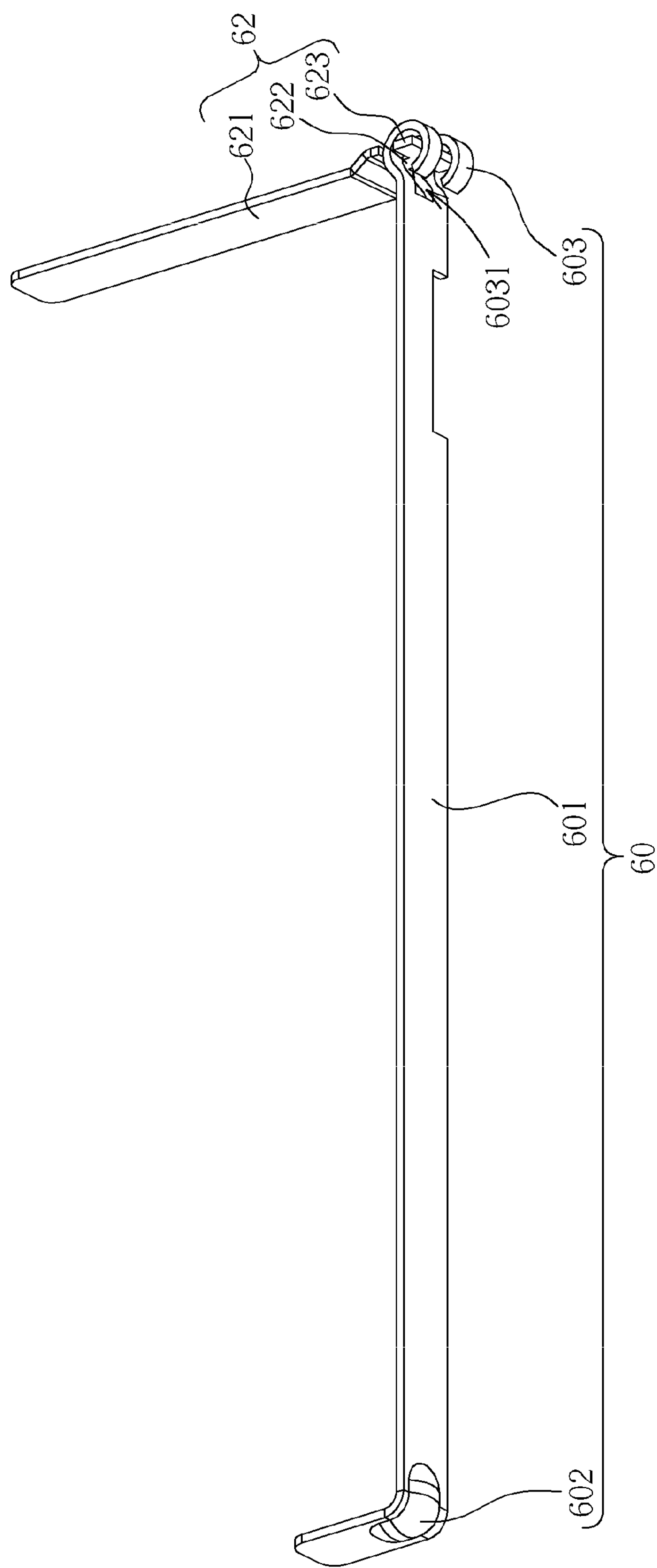
FIG. 4 is a diagram of combination of a driving rod and the pulling rod according to the preferred embodiment of the present invention.
Figure 5:
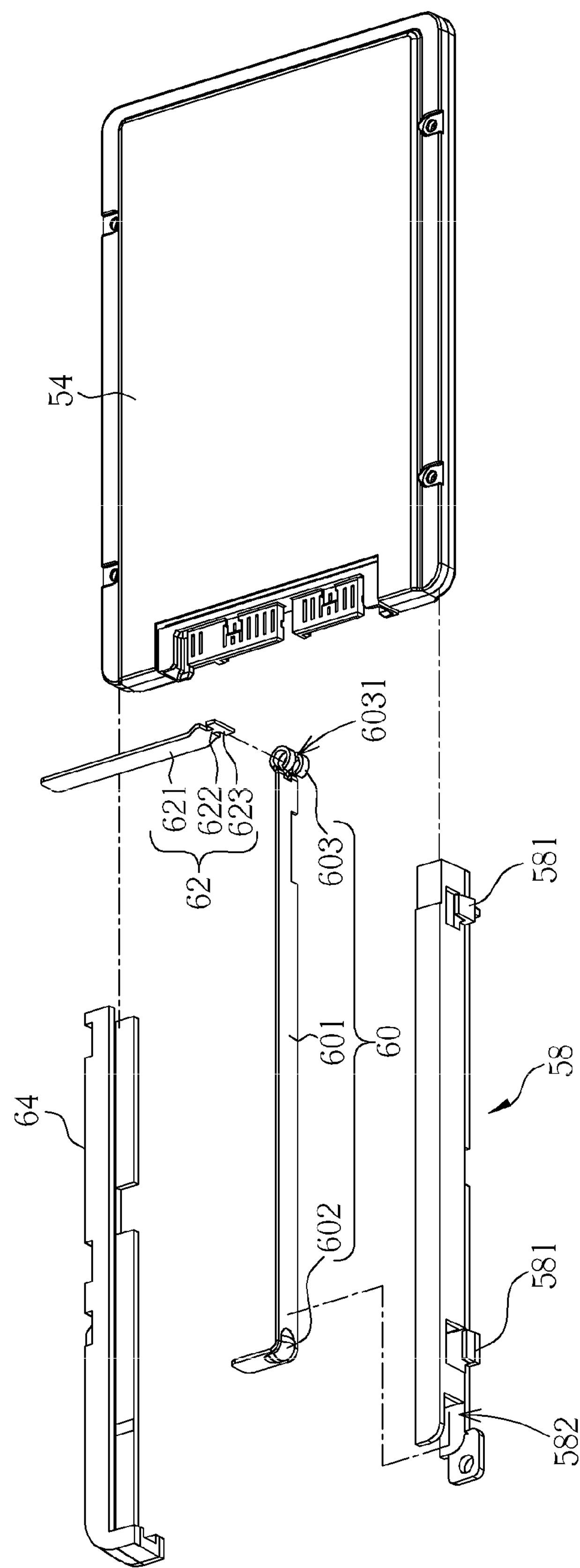
FIG. 5 is an exploded diagram of a removable mechanism according to the preferred embodiment of the present invention.

Please refer to FIG. 4 and FIG. 5. FIG. 4 is a diagram of combination of the driving rod 60 and the pulling rod 62 according to the preferred embodiment of the present invention. FIG. 5 is an exploded diagram of the removable mechanism 56 according to the preferred embodiment of the present invention. The first rail 58 includes at least one fastener 581 for fastening the driving rod 60. A guiding slot 582 is formed on an end of the first rail 58. The driving rod 60 includes a first rod 601 and a hook 602 connected to the first rod 601. The hook 602 is for moving inside the guiding slot 582 in the first direction (X direction) so as to drive the object 54 to move in the first direction and eject from the opening 521 on the housing 52. That is to say, when the object 54 is placed inside the housing 52 completely, an end of the object 54 is positioned on rear ends of the first rail 58 and the second rail 64 and is against the hook 602 of the driving rod 60. When the user pulls the pulling rod 62 to drive the driving rod 60 to move in the first direction (X direction), the hook 602 of the driving rod 60 can push the end of the object 54 to move inside the guiding slot 582 in a specific distance until the hook 602 reaches the end of the guiding slot 582. Therefore, a moving distance that the hook 602 pushes the object 54 is corresponding to a length of the guiding slot 582. For example, the length of the guiding slot 582 can be designed as the distance that the object 54 moves to the opening 521 on the housing 52. In addition, the driving rod 60 further includes a pivoting portion 603 connected to the first rod 601 and pivoted to the pulling rod 62. A slot 6031 is formed on the pivoting portion 603.

Besides, the pulling rod 62 includes a second rod 621, and a width of the second rod 621 is larger than a width of the slot 6031. The pulling rod 62 further includes a passing portion 622 connected to the second rod 621 and for passing through the slot 6031, and a width of the passing portion 622 is smaller than the width of the slot 6031. The pulling rod 62 further includes an wedging portion 623 connected to the passing portion 622, and a width of the wedging portion 623 is larger than the width of the slot 6031, so that the passing portion 622 passes through the slot 6031, and the second rod 621 and the wedging portion 623 are respectively installed on two sides of the pivoting portion 603. Assembly of the pulling rod 62 and the driving rod 60 includes setting the pulling rod 62 transversely on a side of the slot 6031 of the pivoting portion 603 of the driving rod 60 first so that the wedging portion 623 can pass through the slot 6031 smoothly, and then turning the pulling rod 62 from transverse placement to vertical placement. Therefore, because widths of the second rod 621 and the wedging portion 623 are larger than the width of the slot 6031 and the width of the passing portion 622 is smaller than the width of the slot 6031, the pulling rod 62 can be combined with the pivoting portion 603 of the driving rod 60 and can be rotated relative to the driving rod 60. When the pulling rod 62 is rotated out of the housing 52, the user can pull the pulling rod 62 for driving the driving rod 60 to drive the object 54 to move in the first direction (X direction) so as to eject the object 54 from the opening 521 on the housing 52 conveniently.

Comparing to the prior art, the removable mechanism of the present invention can be assembled conveniently and can remove the object easily. Because the housing for loading the object of the present invention is not ejected away with the object, the driving rod is utilized to push the object outward, so that the removable mechanism has advantages of a simple structure and a convenient assembly. Besides, the present invention utilizes the rotary pulling rod to draw the object so as to improve the conventional drawback that the user can not stretch into an inner of the housing for drawing the object. Furthermore, the pulling rod of the present invention can be reused and be attached on other object when exchanging a broken object or updating an old-type object.

Those skilled in the art will readily observe that numerous modifications and alterations of the device and method may be made while retaining the teachings of the invention.

What is claimed is:

1. A removable mechanism comprising:

a first rail disposed inside a housing and on a side of an object for guiding the object to move inside the housing;

a driving rod installed on the first rail in a movable manner for driving the object to move in a first direction; and a pulling rod pivoted to the driving rod for pulling the driving rod to drive the object to move in the first direction so as to eject from the housing when being rotated out of the housing and being pulled.

2. The removable mechanism of claim 1, wherein the first rail comprises at least one fastener for fastening the driving rod.

3. The removable mechanism of claim 1, wherein a guiding slot is formed on an end of the first rail, the driving rod comprises a first rod and a hook connected to the first rod, and the hook is for moving inside the guiding slot in the first direction so as to drive the object to move in the first direction and to eject from the housing.

4. The removable mechanism of claim 3, wherein the driving rod further comprises a pivoting portion connected to the first rod and pivoted to the pulling rod.

5. The removable mechanism of claim 4, wherein a slot is formed on the pivoting portion, and the pulling rod comprises:

a second rod, a width of the second rod being larger than a width of the slot;

a passing portion connected to the second rod and for passing through the slot, a width of the passing portion being smaller than the width of the slot; and a wedging portion connected to the passing portion, a width of the wedging portion being larger than the width of the slot so that the passing portion passes through the slot and the second rod and the wedging portion are respectively installed on two sides of the pivoting portion.

6. The removable mechanism of claim 1, wherein the object is a storage module.

7. The removable mechanism of claim 6, wherein the storage module is a solid state disk.

8. The removable mechanism of claim 1 further comprising:

a second rail disposed inside the housing and on the other side of the object for guiding the object to move inside the housing with the first rail.

9. A removable device comprising:

a housing whereon an opening is formed;

an object disposed inside the housing in a removable manner; and a removable mechanism for ejecting the object from the opening on the housing in a first direction, the removable mechanism comprising:

a first rail disposed inside the housing and on a side of the object for guiding the object to move inside the housing;

a driving rod disposed inside the housing and installed on the first rail in a movable manner for driving the object to move in the first direction; and a pulling rod pivoted to the driving rod for pulling the driving rod to drive the object to move in the first direction so as to eject from the opening on the housing when being rotated out of the housing and being pulled.

10. The removable device of claim 9, wherein the first rail comprises at least one fastener for fastening the driving rod.

11. The removable device of claim 9, wherein a guiding slot is formed on an end of the first rail, the driving rod comprises a first rod and a hook connected to the first rod, and the hook is for moving inside the guiding slot in the first direction so as to drive the object to move in the first direction and to eject from the opening on the housing.

12. The removable device of claim 11, wherein the driving rod further comprises a pivoting portion connected to the first rod and pivoted to the pulling rod.

13. The removable device of claim 12, wherein a slot is formed on the pivoting portion, and the pulling rod comprises:

a second rod, a width of the second rod being larger than a width of the slot;

a passing portion connected to the second rod and for passing through the slot, a width of the passing portion being smaller than the width of the slot; and a wedging portion connected to the passing portion, a width of the wedging portion being larger than the width of the slot so that the passing portion passes through the slot and the second rod and the wedging portion are respectively installed on two sides of the pivoting portion.

14. The removable device of claim 9, wherein the removable mechanism further comprises a second rail disposed inside the housing and on the other side of the object for guiding the object to move inside the housing with the first rail.

15. The removable device of claim 9, wherein the object is a storage module.

16. The removable device of claim 15, wherein the storage module is a solid state disk.

17. The removable device of claim 9 is a portable electronic device or an Ultra Mobile PC (UMPC).

* * * * *